United States Patent [19]
Yokono

[11] Patent Number: 5,346,748
[45] Date of Patent: Sep. 13, 1994

[54] FLUORESCENT DISPLAY PANEL CONTAINING CHIP OF INTEGRATED CIRCUIT WITH DISCREPANCY MARKERS TO AID IN LEAD BONDING

[75] Inventor: Shinji Yokono, Tokyo, Japan

[73] Assignee: NEC Corporation, Japan

[21] Appl. No.: 1,263

[22] Filed: Jan. 7, 1993

[30] Foreign Application Priority Data

Jan. 8, 1992 [JP] Japan .................................. 4-001177
Jan. 27, 1992 [JP] Japan .................................. 4-011495

[51] Int. Cl.⁵ .............................................. B32B 9/00
[52] U.S. Cl. .................................... 428/209; 428/901; 361/748; 361/777
[58] Field of Search ............... 428/209, 210, 901, 690; 361/397, 398, 399, 400, 401, 402, 403, 404, 405, 406, 748, 762, 777; 257/698

[56] References Cited

U.S. PATENT DOCUMENTS 4,513,355  4/1985  Schroeder et al. .................. 257/698
4,835,445  5/1989  Watanabe et al. ................... 361/399

Primary Examiner—Patrick J. Ryan
Assistant Examiner—Patrick R. Jenik
Attorney, Agent, or Firm—Ostrolenk, Faber, Gerb & Soffen

[57] ABSTRACT

In a fluorescent display panel containing an IC chip therein, lead conductor bonding pads exposed from an aperture of an insulator layer are arranged nearby the IC chip mounting area. At least one of the lead conductor bonding pads is provided with marker for indicating the center position of the lead conductor bonding pad. An operator of wire bonding of the display panel observes the marker by a monitor TV, and enters a compensation to a bonding program when necessary.

9 Claims, 5 Drawing Sheets 5,346,748

FLUORESCENT DISPLAY PANEL CONTAINING CHIP OF INTEGRATED CIRCUIT WITH DISCREPANCY MARKERS TO AID IN LEAD BONDING

BACKGROUND OF THE INVENTION

This invention relates to a fluorescent display panel containing a chip of semiconductor integrated circuit-(IC), and more particularly to a position marker for facilitating an automatic wire bonding process.

In a fluorescent display panel containing the IC chip, anode segments and lead conductors are formed on a glass substrate. One end of each lead conductor is connected to a corresponding anode segment, and the other end of the conductor forms a lead conductor bonding pad. An insulator layer is formed on the substrate by using a thick film process so as to cover the lead conductors. The insulator layer has an aperture for exposing the surfaces of the lead conductor bonding pads.

The IC chid is mounted on the substrate such that each IC bonding pad is wire-bonded to a corresponding lead conductor bonding pad.

In an operation of a fluorescent display panel, a selected anode segment is connected to an anode voltage through an IC bonding pad and a corresponding lead conductor bonding pad. Only the selected anode segments radiate fluorescent layers formed on the segments.

An automatic wire bonding machine which is program-controlled by a host computer performs the wire bonding between the IC bonding pad to a corresponding lead conductor bonding pad. The operator of this automatic wire bonding machine monitors the wire bonding through an ITV(industrial television)display.

The tip of the bonding tool of the bonding machine is position-controlled to a design center of a lead conductor bonding pad, which is stored as a data in the control program. And there is a problem of position error of the aperture of the insulator layer. Although all the centers of the lead conductor bonding pads are within an allowable range from their design center, the position of an aperture may differ by a large amount from its design position.

Since the insulator layer is formed by using screen printing, there are a variety of factors causing position errors of the aperture. A screening sheet for printing may be slackened after a number of printings, and such slackness of a screening sheet may be different at different places of the sheet. In a recent tendency, many anode segments are formed on a large glass substrate, and large area of insulator layer are formed by a single printing. As a result, it is difficult to maintain a correct positions of the aperture on the substrate.

When the position of the aperture of the insulator layer is different by a large amount from its design position, a part or the whole body of the tip of the bonding tool, which is controlled to the design center of a lead conductor bonding pad, may be placed on the insulator layer outside of the aperture. This causes an unreliable wire bonding, and originates troubles in the bonding process and in the succeeding processes.

When the automatic wire bonding machine is controlled by a program having different position data for different anode areas, the problem caused from the position error of the insulator layers can be avoided, but this makes the control program and control itself complex.

SUMMARY OF THE INVENTION

Therefore, an object of the present invention is to add a simple device for compensating the tip position of the bonding tool, to a fluorescent display panel containing a chip of integrated circuit.

A pair of simple markers displayed on an ITV display supplies sufficient information for compensating the tip position of the bonding tool.

Thus, in a first embodiment of this invention, a center marker and a discrepancy detection marker are provided on at least one lead conductor bonding pad.

In a second embodiment of this invention, the center marker and the discrepancy detection marker are denoted by two different parts of a marker figure.

In a third embodiment of this invention, a start point marker and an end point marker are provided on at least one lead conductor bonding pad, and in a fourth embodiment of this invention, the start point marker and the end point marker are denoted by two different parts of a marker figure.

BRIEF DESCRIPTION OF THE DRAWINGS

Further objects, features, and advantages of this invention will become apparent from a consideration of the following description, the appended claims, and the accompanying drawings in which the same numerals indicate the same or the corresponding parts.

DETAILED DESCRIPTION OF THE PREFERRED EMBODIMENTS

Figure 5:
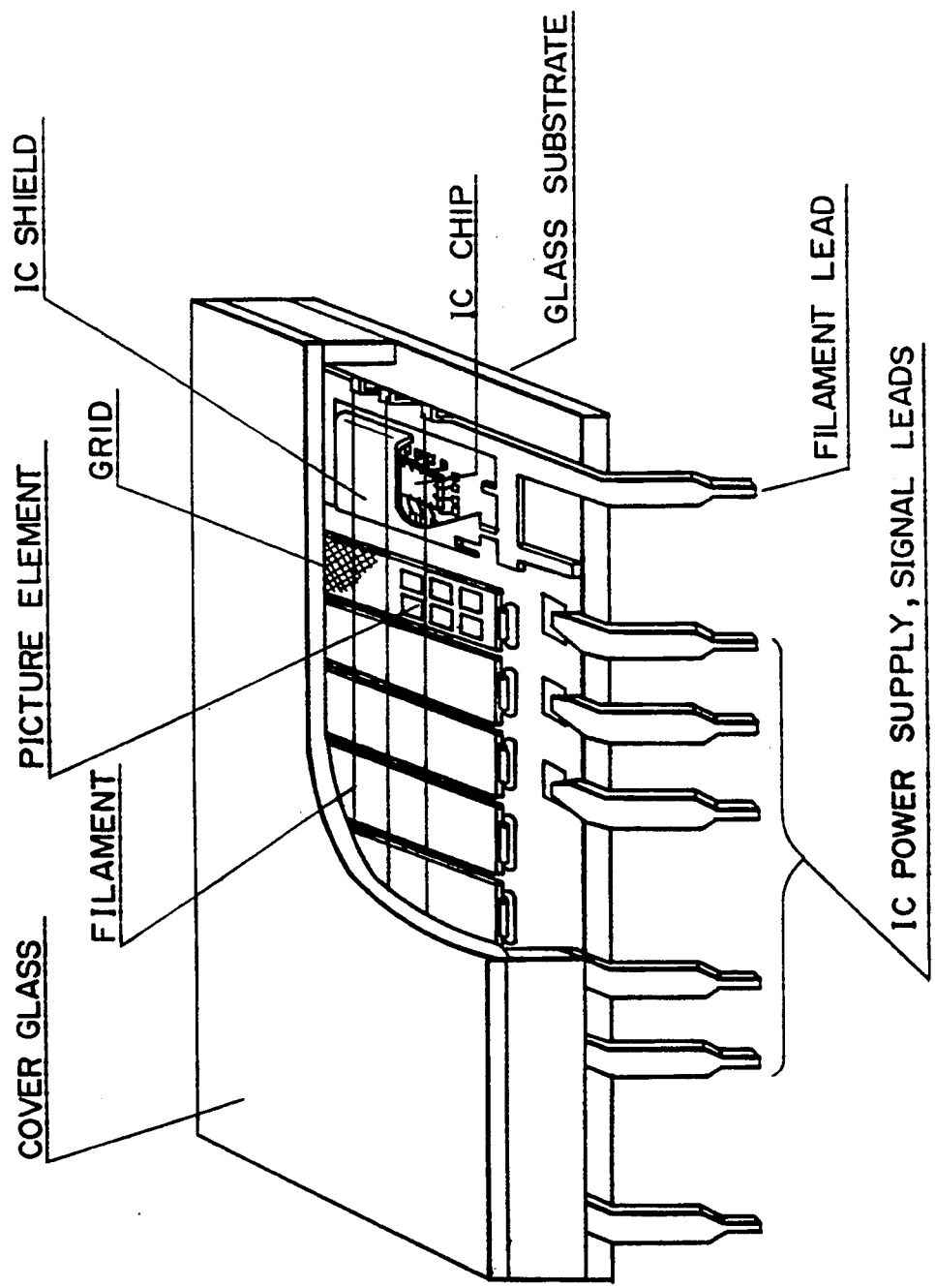
FIG. 5 shows a perspective view illustrating a basic structure of a fluorescent display panel.

Referring to FIG. 5 in which a basic structure of a fluorescent display panel is illustrated, a glass substrate and a cover glass constitute a vacuum container. On the glass substrate, anode segments denoted as picture elements in FIG. 5, an IC chip, and lead conductors are formed. Filament type common cathode and electron accelerating grid are formed in front of the anode segments.

Figure 1A:
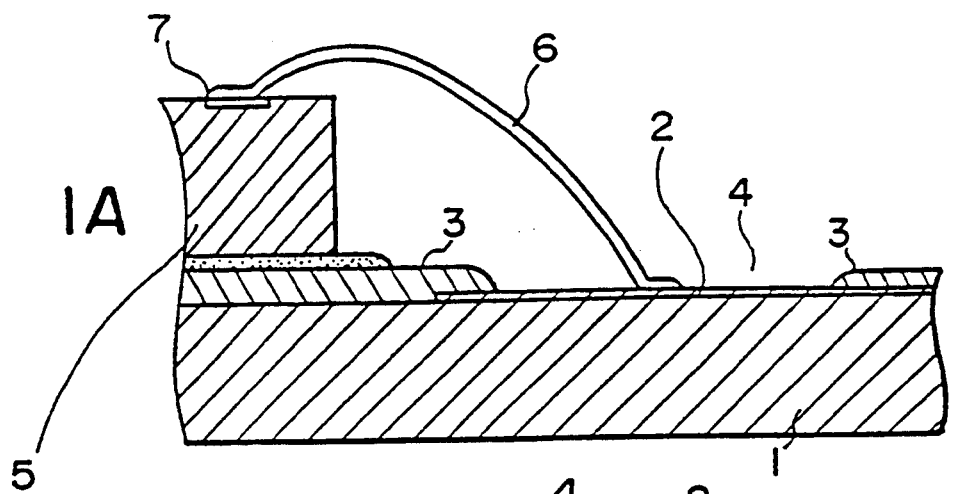
FIG. 1A shows a partial crosssectional view of a first embodiment of this invention.
Figure 1B:
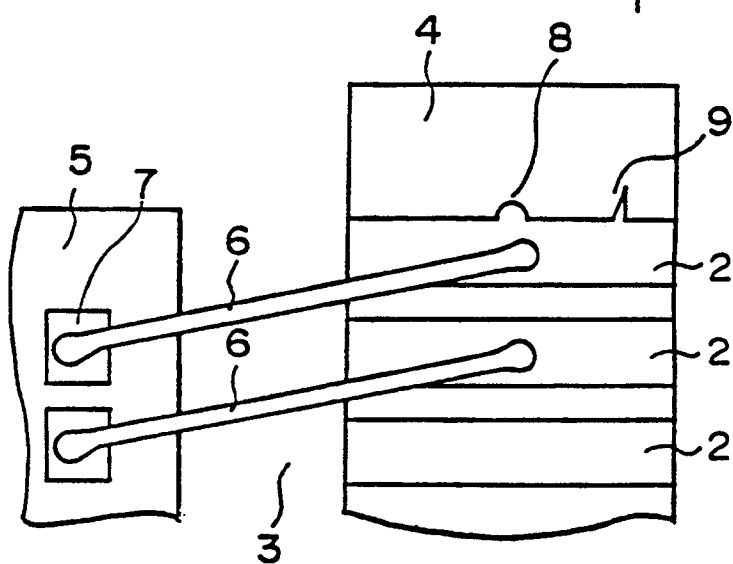
FIG. 1B is a plan view of FIG. 1A.

Now referring to FIG. 1A and FIG. 1B, only a part of wire bonding area is shown in the drawings. There is a set of anode segments (not shown in FIG. 1A) formed on the substrate 1, and each anode segment is covered by a fluorescent material. Cathode and grid electrodes are not shown in the drawings.

The anode segments and the lead conductor bonding pads 2 of the lead conductors are made of a thin aluminum film on the glass substrate 1 and patterned, for example, by etching. An insulator layer 3 is formed by using a thick film process leaving an aperture 4 for exposing the surfaces of the lead conductor bonding pads 2. On the insulator layer 3, a chip of a semiconductor integrated circuit(IC) 5 as a driver element is mounted. The IC chip 5 supplies an anode voltage to a selected anode segment through an IC bonding pad 7, an aluminum wire 6, a lead conductor bonding pad 2, and a corresponding lead conductor.

In a heretofore produced fluorescent display panel containing a driver IC chip, there are no markers on lead conductor bonding pads 2, and the operator of the wire bonding can not detect the design center of a lead conductor bonding pad 2 on the ITV display.

In an embodiment shown by FIG. 1B, a center marker 8 and a discrepancy detection marker 9 which is apart from the center marker 8 by a predetermined distance, are provided on a lead conductor bonding pad 2. These protruding markers are produced at patterning process of the lead conductor bonding pads 2.

A bonding program for automatic wire bonding between a lead conductor bonding pad 2 and a corresponding IC bonding pad 7 by using an aluminum wire 6 is newly prepared or revised when an array of anode segments are completed on a glass substrate 1. In this preparation of the bonding program, the aperture 4 is observed by the ITV display on which the dimensions are magnified. If both of the center marker 8 and the discrepancy detection marker 9 are visible in the aperture 4, the design position of the center marker 8 is used in the bonding program as a data at which the tip of the bonding tool is to be positioned. And by this single data, a reliable bonding on all the lead conductor bonding pads of all the anode areas are guaranteed.

And if a part or the whole body of the discrepancy detection marker 9 is covered with the insulator layer 3 in any one of the lead conductor bonding pad 2, the single data of the design center must be compensated in these anode areas where the discrepancy detection marker 9 is covered with the insulator layer 3. When the data in the bonding program is not compensated, a part of the tip of the bonding tool may touch the surface of the insulator layer 3 and makes the bonding unreliable. In such a case, a reliable bonding is obtained by compensating the design center position along a line of printing.

The distance between the center marker 8 and the discrepancy detection marker 9 is determined by consideration of the thickness of the insulator layer 3, the dimension of the aperture 4, the shape and the dimension of the tip of the bonding tool, and the stroke of the bonding tool at bonding. An example in a trial production was 300 μm.

The direction of the discrepancy detection marker 9 from the center marker 8 is determined by consideration of the direction of printing of the insulator layer 3, and when the direction of printing is reversed, the discrepancy detection marker 9 is formed on the opposite side of the center marker 8.

Figure 2A:
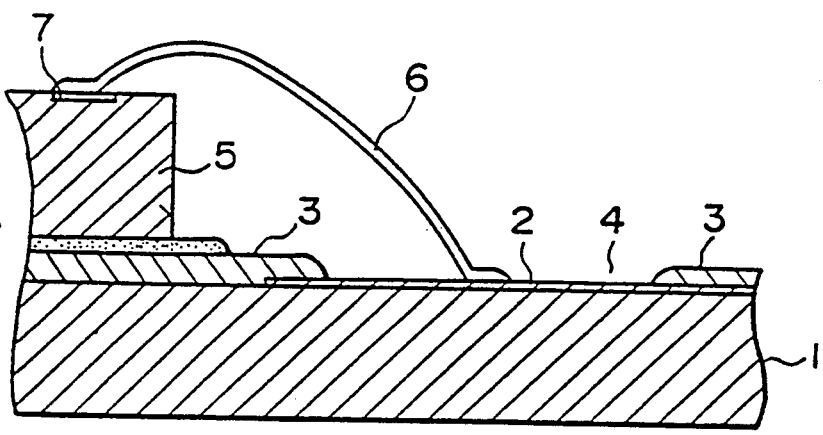
FIG. 2A shows a partial crosssectional view of a second embodiment of this invention.
Figure 2B:
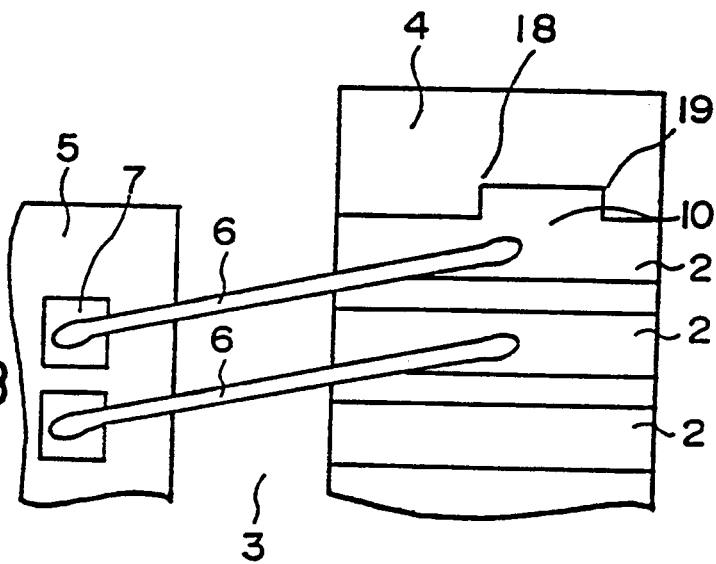
FIG. 2B shows a plan view of FIG. 2A.

FIG. 2A and FIG. 2B show a second embodiment of this invention, where a center marker 18 and a discrepancy detection marker 19 are denoted by opposing two sides of a marker FIG. 10. It is apparent that these markers 18 and 19 in FIG. 2 can be used just in a same way as the markers 8 and 9 in FIG. 1.

When the operator of the wire bonding can roughly determine the distance from the center marker 8 to a side line of the aperture 4 on the ITV display, a single center marker is sufficient for determining the compensation of the bonding program.

Figure 3A:
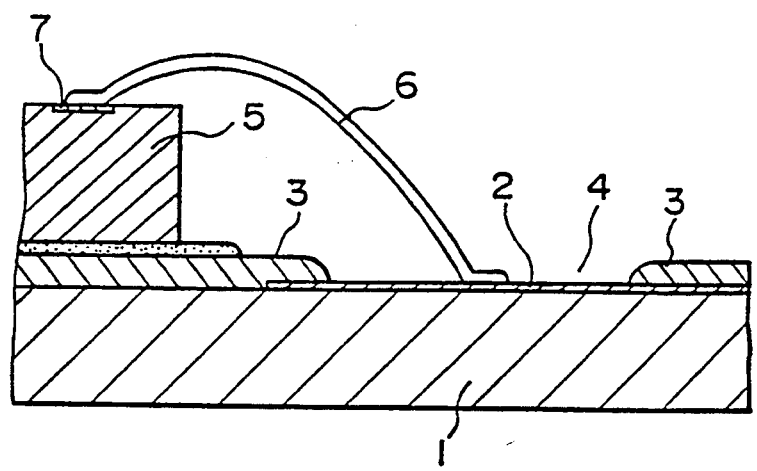
FIG. 3A shows a partial crosssectional view of a third embodiment of this invention.
Figure 3B:
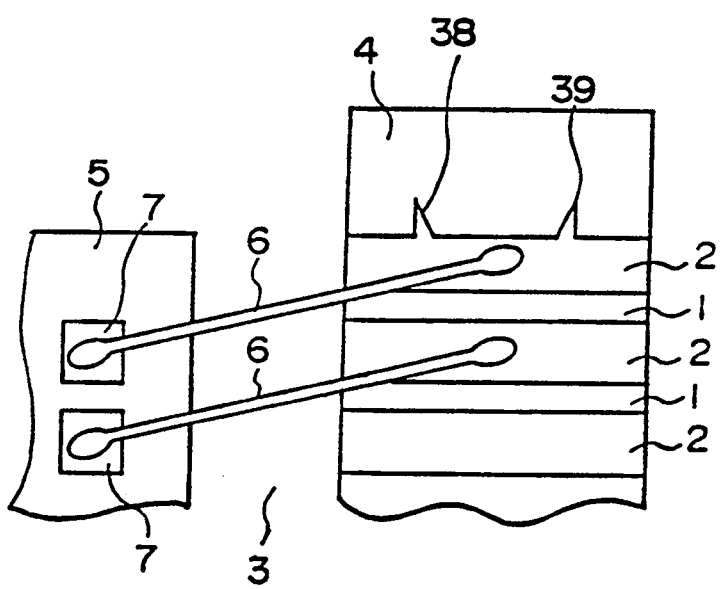
FIG. 3B shows a plan view of FIG. 3A.

FIG. 3A and FIG. 3B show a third embodiment of this invention, where start point marker 38 and an end point marker 39 are formed on a lead conductor bonding pad 2. The distance between the start point marker 38 and the end point marker 39 is set to a predetermined length, and the center point between the two markers 38 and 39 is set at the design center of a lead conductor bonding pad 2.

In the preparation of the bonding program, each aperture 4 on each anode area 1 is observed by the ITV display. If both the start point marker 38 and the end point marker 39 are visible in the aperture 4, the design center position of the lead conductor bonding pad 2 is used as a data at which the tip of the bonding tool is to be positioned. And by this single data, a reliable bonding on all the lead conductor bonding pads 2 is guaranteed.

And if either one of the start point marker 38 and the end point marker 39 is screened by the insulator layer 3, the operator can detect the direction and the rough amount of the position error of the aperture and can make a necessary compensation on the data in the bonding program.

Figure 4A:
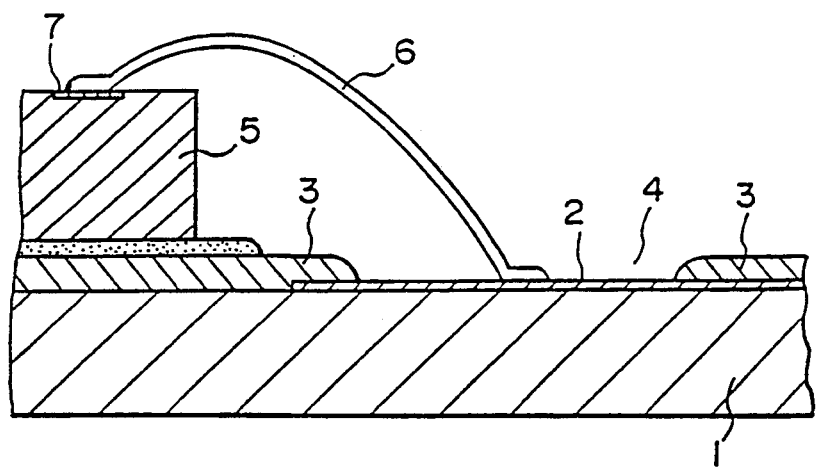
FIG. 4A shows a partial crosssectional view of a fourth embodiment of this invention.
Figure 4B:
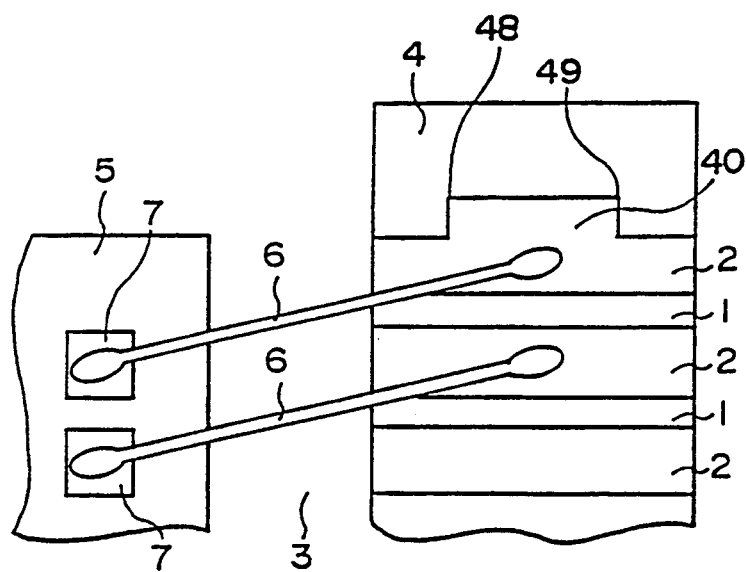
FIG. 4B shows a plan view of FIG. 4A.

FIG. 4A and FIG. 4B show a fourth embodiment of this invention, where a start point marker 48 and an end point marker 49 are denoted by opposing two sides of a marker FIG. 40. It is apparent that these markers 48 and 49 in FIG. 4B can be used just in a same way as the markers 38 and 39 in FIG. 3.

When markers are composed of a center marker, a start point marker, and an end point marker, the operator of the wire bonding can estimate the discrepancy of the aperture center from the center of the lead conductor bonding pad more accurately.

Only preferred embodiments have been described herein. But it must be understood that various modifications can be made without departing from the scope of this invention.

What is claimed is:

1. A fluorescent display panel comprising: a set of anode segments formed on a substrate; a fluorescent layer formed on said anode segments; a set of lead conductors formed on said substrate, each lead conductor of said set of lead conductors being connected to a corresponding anode segment at one end and forming a lead conductor bonding pad at the other end; an insulator layer formed on said substrate by a thick film process for covering said set of lead conductors; an aperture formed in said insulator layer for exposing surfaces of said lead conductor bonding pads, a chip of an integrated circuit mounted on said substrate; a set of bonding wires, each bonding wire of said set of bonding wires electrically connecting a bonding pad of said chip of integrated circuit to a corresponding bonding pad of a lead conductor; and at least one marker means formed on a lead conductor bonding pad including a center marker and a discrepancy marker for indicating a position discrepancy of said insulator layer from a designed position.

2. The fluorescent display panel according to claim 1, wherein said center marker is formed at said center position of said one of lead conductor bonding pads.

3. The fluorescent display panel according to claim 1, wherein said center marker is formed at a center position of said one of lead conductor bonding pads and a discrepancy detection marker formed on said one of lead conductor bonding pads at a predetermined distance from said center marker.

4. The fluorescent display panel according to claim 3, wherein said center marker and said discrepancy marker are denoted by two parts of a marker figure.

5. The fluorescent display panel according to claim 1, wherein said discrepancy marker comprises a start point marker and an end point marker formed on said one of lead conductor bonding pads.

6. The fluorescent display panel according to claim 5, wherein said start point marker and said end point marker are denoted by two parts of a marker figure.

7. The fluorescent display panel according to claim 1, wherein said marker means comprises a start point marker, said center marker, and an end point marker.

8. A fluorescent display panel, comprising:
a set of anode segments formed on a substrate;
fluorescent layer formed on said anode segments;
a set of lead conductors formed on said substrate, each lead conductor of said set of lead conductors being connected to a corresponding anode segment at one end and forming a lead conductor bonding pad at an other end;
an insulator layer formed on said substrate by a thick film process for covering said set of lead conductors;
an aperture formed in said insulator layer for exposing surfaces of said lead conductor bonding pads;
a chip of an integrated circuit mounted on said substrate;
a set of bonding wires, each bonding wire of said set of bonding wires electrically connecting a bonding pad of said chip of integrated circuit to a corresponding bonding pad of a lead conductor; and
at least one marker means formed on a lead conductor bonding pad including a center marker and a discrepancy marker for indicating a position discrepancy of said insulator layer from a designed position, said position discrepancy being indicated by openings formed on two sides of said marker means from two boundaries of said aperture.

9. A fluorescent display panel comprising:
a set of anode segments formed on a substrate;
fluorescent layer formed on said anode segments;
a set of lead conductors formed on said substrate, each lead conductor of said set of lead conductors being connected to a corresponding anode segment at one end and forming a lead conductor bonding pad at the other end;
an insulator layer formed on said substrate by thick film process for covering said set of lead conductors;
an aperture formed in said insulator layer for exposing surfaces of said lead conductor bonding pads;
a chip of an integrated circuit mounted on said substrate;
a set of bonding wires, each bonding wire of said set of bonding wires electrically connecting a bonding pad of said chip of integrated circuit to a corresponding bonding pad of a lead conductor; and
at least one marker means formed on a lead conductor bonding pad including a center marker and a discrepancy marker for indicating position discrepancy of said insulator layer from a designed position, one end of said marker means forming said center marker at which a bonding tip is to be positioned when said position discrepancy is sufficiently small and an other end of said marker figure forming said discrepancy marker indicating an amount of said discrepancy from a boundary of said aperture.

* * * * *